US006754553B2

(12) United States Patent
Wieczorek et al.

(10) Patent No.: US 6,754,553 B2
(45) Date of Patent: Jun. 22, 2004

(54) IMPLANT MONITORING USING MULTIPLE IMPLANTING AND ANNEALING STEPS

(75) Inventors: Karsten Wieczorek, Boxdorf (DE); Manfred Horstmann, Dresden (DE); Christian Krueger, Liegau-Augustusbad (DE)

(73) Assignee: Advanced Micro Devices, Inc., Austin, TX (US)

(*) Notice: Subject to any disclaimer, the term of this patent is extended or adjusted under 35 U.S.C. 154(b) by 519 days.

(21) Appl. No.: 09/820,033

(22) Filed: Mar. 28, 2001

(65) Prior Publication Data

US 2002/0059011 A1 May 16, 2002

(30) Foreign Application Priority Data

Nov. 16, 2000 (DE) .......................................... 100 56 872

(51) Int. Cl.$^7$ .............................................. G06F 19/00
(52) U.S. Cl. ........................................ 700/121; 700/124
(58) Field of Search ............................... 700/121, 124

(56) References Cited

U.S. PATENT DOCUMENTS 4,863,877 A * 9/1989 Fan et al. ................... 438/492
5,861,632 A * 1/1999 Rohner .................... 250/492.21
6,472,232 B1 * 10/2002 Johnson et al. ............... 438/14
6,489,801 B1 * 12/2002 Borden et al. .............. 324/766

* cited by examiner

Primary Examiner—Leo Picard
Assistant Examiner—Michael D. Masinick
(74) Attorney, Agent, or Firm—Williams, Morgan & Amerson, P.C.

(57) ABSTRACT

Test wafer consumption is a significant contributor to overall cost of manufacturing in semiconductor industry due to scrapping the test wafers after one monitoring of implantation parameters. This invention provides a method to reuse the same test wafer for monitoring the implantation parameters more than once. This method comprises the possibility of implanting the same implant species together with identical implanting and annealing conditions as well as of implanting a broad variety of implant species together with varying implanting and annealing conditions. Therefore, this invention helps to significantly reduce the number of test wafers consumed in the implant-area.

9 Claims, 4 Drawing Sheets

IMPLANT MONITORING USING MULTIPLE IMPLANTING AND ANNEALING STEPS

BACKGROUND OF THE INVENTION

1. Field of the Invention

The present invention relates to a method of monitoring implantation parameters for manufacturing of semiconductor devices using test wafers for obtaining information on ion-implantation characteristics. The present invention, in particular, relates to methods of monitoring ion-implantation of a plurality of ion species having alternating doping polarity or of the same ion species and having variable implantation depth.

2. Description of the Invention

The manufacture of semiconductor devices requires a large number of discrete process steps to create a packaged semiconductor circuit device, starting from a blank semiconductor substrate, which is usually provided as a semiconductor wafer. The semiconductor device manufacturer fabricates semiconductor circuit devices, e.g., microprocessors, DRAM (dynamic random access memory) chips, and ASIC (application specific integrated circuit) chips, and the like, on individual wafers, usually forming a number of devices on each wafer. The individual fabrication processes for semiconductor circuit devices include photolithography, ion-implantation, etching and other associated fabrication processes known in the art. To successfully produce the semiconductor devices with high production yield, all of the above processes must perform reliably according to tight process specifications. To ensure that these processes perform according to the specifications, typically, selected semiconductor wafers, herein referred to as test wafers, are frequently and periodically introduced into the various fabrication processes to control and properly adjust process parameters of these steps.

For the ion-implantation process, implant homogeneity of every implanted ion species across the wafers, which have usually diameters up to 8 inches (20.32 cm) or 12 inches (30.48 cm), is very important. Uniform ion-implantation is required for a high process yield. After ion-implantation has been completed, annealing of such a wafer, e.g., rapid thermal annealing (RTA), is necessary to electrically activate the implanted ions and build the implanted ions into the lattice of the wafer by means of substitution. By electrical activation, the electrical characteristics of the implanted substrate, such as the local electrical sheet-resistance ($R_s$), are representative of the implantation parameters. Relying on the fact that RTA annealing and its effects on the electrical activation are substantially homogeneous across the whole wafer, homogeneity of every implanted ion species across the wafer, as represented by the local electrical sheet-resistance, is influenced only by the ion-implantation process.

Process specifications are equally tight for all chips produced on a wafer. Therefore, homogeneity of implantation parameters must be ascertained to obtain a high production yield for any chip independent of the location on the production wafer. Monitoring of ion-implantation normally makes use of local electrical sheet-resistance measurements with a four-point-probe technique repeatedly applied to locations distributed across the whole wafer. This type of measurement is well known to the person skilled in the art. The four-point-probe technique measures the resistivity $\rho$ using four probes on a surface of a blank semiconductor wafer. These probes are aligned on a straight line and have a constant spacing s (in cm). A current I (in mA) is passed through the outer probes and a voltage V (in mV) is measured between the inner probes. The measured resistance VI is converted to resistivity $\rho$ (in $\Omega \cdot$cm) according to the commonly known formula $$\rho = (V/I) 2\pi s.$$

In order to obtain reliable test results, rather expensive wafers, e.g., silicon on insulator wafers, which are also used for device production, are employed as test wafers. Conventionally, the ion-implantation monitoring using implant monitor test wafers requires one wafer per implant species, implantation dose, implantation depth, and test-run.

With reference to FIGS. 1a and 1b, an illustrative example of implanting ions into a lightly doped silicon wafer according to a typical prior art process will be described. It is to be noted that FIGS. 1a and 1b as well as the following drawings in this application are merely schematic depictions of the various stages in manufacturing the illustrative device under consideration. The skilled person will readily appreciate that the dimensions shown in the figures are not true to scale and that different portions or layers are not separated by sharp boundaries as portrayed in the drawings but may instead comprise continuous transitions. Furthermore, various process steps as described below may be performed differently depending on particular design requirements. Moreover, in this description, only the relevant steps and portions of the device necessary for understanding the present invention are considered.

FIG. 1a shows a schematic cross-sectional view of a wafer 101 comprising a silicon substrate 102 with a surface 103, whereby the silicon substrate 102 is lightly doped with a first species of implanted ions. According to a conventional implantation process 104 a second species of ions, which is a counterdoping species to the first species, is implanted through surface 103 into the wafer 101 with an implantation dose until a desired implantation depth is reached. For activation of the second species of ions, i.e., building the newly implanted ions into the lattice of the wafer 101 by means of substitution, an anneal must be applied to the wafer 101.

FIG. 1b shows a schematic cross-sectional view of the wafer 101 after ion-implantation and RTA annealing. An implanted layer 105 comprising the second species of ions is formed in the wafer 101 according to the above-mentioned implantation process 104. Between the implanted layer 105 and the silicon substrate 102 a pn-junction 106 is formed in the desired implantation depth. After the annealing step, sheet-resistance of the substrate is measured by local four-point-probe measurements distributed across the whole substrate to determine implantation characteristics, and, in particular, homogeneity. After implantation characteristics are obtained, the substrate is discarded according to the prior art.

Consequently, there is a great overall test wafer consumption during manufacturing of semiconductor devices. This test wafer consumption is a significant contributor to the cost of manufacturing in semiconductor industry mainly due to scrapping the test wafers after only one instance of monitoring the implantation parameters. Therefore, there is a great desire to reduce the overall test wafer consumption and, accordingly, the cost of manufacturing.

SUMMARY OF THE INVENTION

The present invention provides a method of reusing ion-implantation test wafers for monitoring implantation parameters.

According to a first embodiment of the present invention, a method of monitoring implantation parameters for characterization of an implantation apparatus is provided, the method comprising providing a substrate for use as a test wafer for monitoring the implantation parameters, implanting first ions into the substrate, and annealing the substrate with the first ions implanted. The method also comprises obtaining the implantation parameters by measuring implantation-dependent characteristics of the substrate with the first ions implanted, implanting second ions into the substrate with the first ions implanted, and annealing the substrate with the first and second ions implanted. The method further comprises obtaining the implantation parameters by measuring implantation-dependent characteristics of the substrate with the first and second ions implanted, reusing the substrate for a further parameter-measuring process.

According to a second embodiment of the present invention, a method of monitoring implantation parameters for characterization of an implantation apparatus is provided, the method comprising providing a substrate for use as a test wafer for monitoring the implantation parameters, implanting first ions of a first species into the substrate, and annealing the substrate with the first ions implanted. The method also comprises obtaining the implantation parameters by measuring implantation-dependent characteristics of the substrate with the first ions implanted, implanting second ions of a second species into the substrate with the first ions implanted, and annealing the substrate with the first and second ions implanted. The method further comprises obtaining the implantation parameters by measuring implantation-dependent characteristics of the substrate with the first and second ions implanted, reusing the substrate for a further parameter-measuring process.

According to this second embodiment of this invention, the second ion-implantation is of a different implant species from the first ion-implantation. If, in addition, varying implantation conditions are used, alternating pn-junctions with successively decreasing junction-depth are created in the test wafer. Since the pn-junctions isolate the underlying substrate from the wafer surface, only the characteristics of the top implantation layer are subject to electrical measurement.

According to a third embodiment of the present invention, a method of monitoring implantation parameters for characterization of an implantation apparatus is provided, the method comprising providing a substrate for use as a test wafer for monitoring the implantation parameters, implanting first ions of a first species into the substrate, and annealing the substrate with the first ions implanted. The method also comprises obtaining the implantation parameters by measuring implantation-dependent characteristics of the substrate with the first ions implanted, implanting second ions of the first species into the substrate with the first ions implanted, and annealing the substrate with the first and second ions implanted. The method further comprises obtaining the implantation parameters by measuring implantation-dependent characteristics of the substrate with the first and second ions implanted, reusing the substrate for a further parameter-measuring process.

According to this third embodiment of this invention, the second ion-implantation uses the same implant species as the first ion-implantation, and identical implanting and annealing conditions. This method enables a reusing of the test wafer until the sheet-resistance sensitivity starts to degrade by dopant saturation. This method may be applied to any known implant species.

As a result of the present invention, there is a significant cost-reduction in implant-areas of the semiconductor device manufacturing industries, due to reusing the expensive test wafers.

BRIEF DESCRIPTION OF THE DRAWINGS

Further advantages and objects of the present invention will become more apparent with the following detailed description when taken with reference to the accompanying drawings in which:

FIG. 2b is a diagram of a graph as a result of a simulation of an implantation of first ions in a lightly doped semiconductor substrate according to FIG. 2a;

DETAILED DESCRIPTION OF SPECIFIC EMBODIMENTS

Figure 1A:
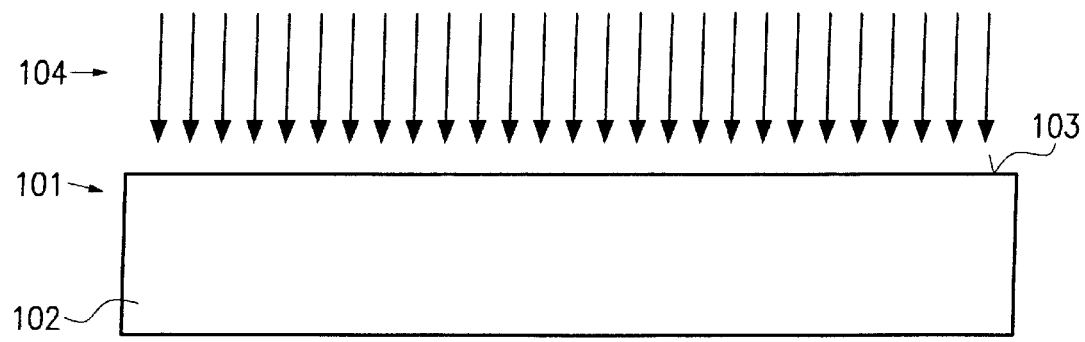
FIG. 1a is a schematic cross-sectional view of a lightly doped semiconductor substrate during ion-implantation according to the prior art.
Figure 1B:
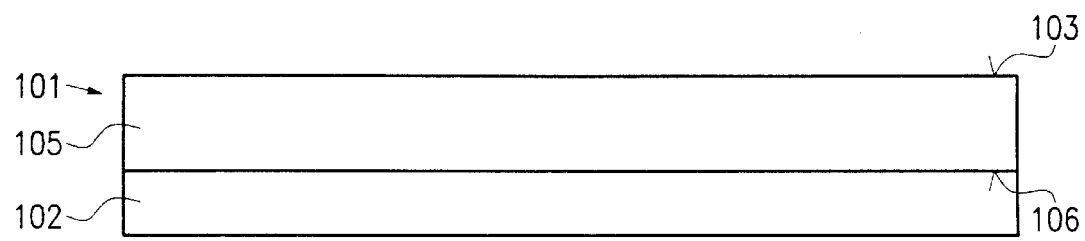
FIG. 1b is a schematic cross-sectional view of the lightly doped semiconductor substrate after ion-implantation, annealing, and formation of a pn-junction according to the prior art.

While the present invention is described with reference to the embodiments as illustrated in the following detailed description as well as in the drawings, it should be understood that the following detailed description as well as the drawings are not intended to limit the present invention to the particular embodiments disclosed, but rather the described embodiments merely exemplify the various aspects of the present invention, the scope of which is defined by the appended claims.

Various embodiments of the method according to the present invention shall now be illustrated in the following description with reference to the drawings.

A first embodiment of this invention relates to reuse of test wafers for cycles of ion-implantation, RTA and monitoring steps such that different implanting conditions are applied to the same wafer. The different implanting conditions comprise using alternating counterdoping species for subsequent ion-implantations and gradually decreasing implantation depth. The counterdoping species may be chosen from any known implant species, preferably, from those used in actual device fabrication. Monitoring of implantation parameters, especially the implantation concentration, is also performed by four-point-probe sheet-resistance measurements. Such an alternating implantation of counterdopants results in pn-junctions in specific corresponding depths of the test wafer after RTA annealing. These pn-junctions isolate the later-implanted layer from the substrate or the previous layers, respectively. The implantation concentration of the latest implantation step is always directly related to the sheet-resistance of the surface of the test wafer implanted with ions. Therefore, such monitoring is performed with the required sensitivity for the sheet-resistance.

Consequently, the implant conditions for the steps of ion-implantation and RTA annealing have to be designed to result in alternating layers of pn-junctions with successively decreasing depth. This is due to the fact that the layer under investigation is electrically decoupled from the previously characterized implant-layers.

In the following example a more detailed description of this embodiment of the present invention is given:

A test wafer of silicon lightly doped with boron and a doping concentration of $1\times10^{14}$ ions per $cm^3$ is implanted with phosphorus at an implantation energy of 80 keV. By RTA annealing for 30 s at a temperature of 1050° C., a pn-junction is formed at a depth of about 300 nm. The implanted n-silicon layer above the pn-junction features a sheet-resistance of about 1740 $\Omega/\square$ which corresponds to a phosphorus implantation dose of $1\times10^{13}$ ions per $cm^2$.

Following this step, as a counterdopant to phosphorus, borondifluoride (BF$_2$) is implanted with an implantation energy of 80 keV into the test wafer. After RTA annealing the test wafer, again for 30 s at a temperature of 1050° C., a second pn-junction is formed at a depth of about 95 nm. A sheet-resistance of about 10 kΩ/□ is featured. This sheet-resistance corresponds to a BF$_2$ implantation dose of $1 \times 10^{13}$ ions per cm$^2$.

The counterdopant to BF$_2$ in the next following implantation step is arsenic (As) which is implanted with an implantation energy of 30 keV into the test wafer. By an anneal under conditions equal to the above anneals, which again comprises RTA annealing the test wafer for 30 s at a temperature of 1050° C., a third pn-junction is formed at a depth of about 41 nm. The measurement of the resulting sheet-resistance results in a value of 3850 Ω/□ which corresponds to an arsenic implantation dose of $1 \times 10^{13}$ ions per cm$^2$. Therefore, a test wafer according to this example of the further embodiment of this invention is used four times for monitoring. This leads to a test wafer-to-product wafer ratio for this kind of monitoring that is three times lower than according to the commonly known prior art.

This exemplary process according to the present invention is illustrated in the drawings of FIGS. 2a to 2f.

Figure 2A:
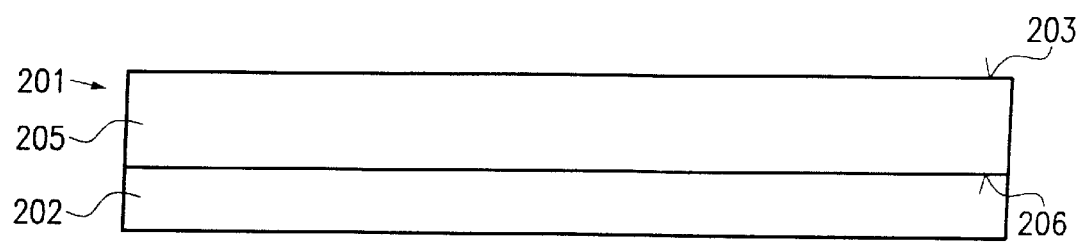
FIG. 2a is a schematic cross-sectional view of a lightly doped semiconductor substrate of one embodiment of this invention after a first implanting and annealing step.

FIG. 2a shows a schematic cross-sectional view of a wafer 201 comprising a silicon substrate 202 with a surface 203, whereby the silicon substrate 202 is lightly doped with an initial species of implanted ions, and a first implanted layer 205 after ion-implantation and RTA annealing. Annealing is necessary for activation of the first species of ions, i.e., building the newly implanted ions into the lattice of the wafer 201 by means of substitution. This first implanted layer 205 is formed by implanting and annealing a first species of ions, which is a counterdoping species to the initial species, through surface 203 into the wafer 201 with a first implantation dose. Between the first implanted layer 205 and the silicon substrate 202, a first pn-junction 206 is formed in a first desired implantation depth. Due to the first pn-junction 206, the first implanted layer 205 is electrically isolated from the silicon substrate 202. A measurement of the sheet-resistance by a four-point-probe technique will enable conclusions about the actually implanted dose of ions of the first species.

Figure 2B:
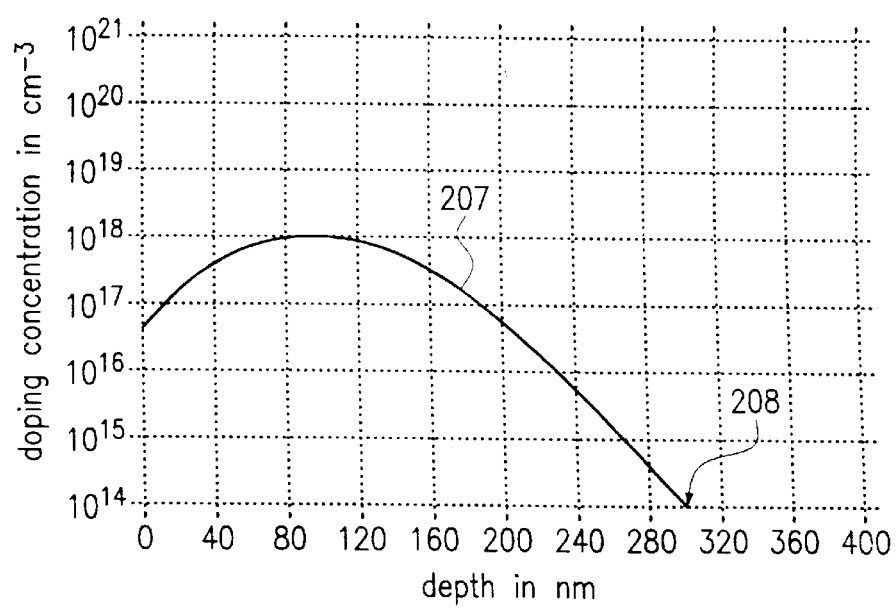

FIG. 2b shows a diagram of a graph 207 as a result from an exemplary computer-simulation for the wafer 201 according to FIG. 2a. The diagram shows as the x-axis the implantation depth (in nm) relative to the surface 203 of the wafer 201 and as the y-axis the doping concentration (in cm$^{-3}$) of the corresponding layer. The graph 207 represents an ion-substitution of a first species of implanted ions in the wafer 201 and a first implanted layer 205 formed thereby according to a sheet-resistance of about 1740 Ω/□. The wafer 201 has a basic doping of $1 \times 10^{14}$ ions per cm$^3$ of an initial species of ions. The implantation of the ions of the first species was assumed with an implantation energy of 80 keV and an implantation dose of $1 \times 10^{13}$ ions per cm$^2$. Graph 207 shows that the first pn-junction 206 is formed at a depth of about 300 nm under the surface 203 of the wafer 201. The first pn-junction 206 is represented in graph 207 by point 208.

The RTA annealing step with a duration of 30 s at a temperature of 1050° C. is supposed to be constant for this and all following computer-simulations. Therefore, only the varying ion-implantations contribute to the measured sheet-resistances.

Figure 2C:
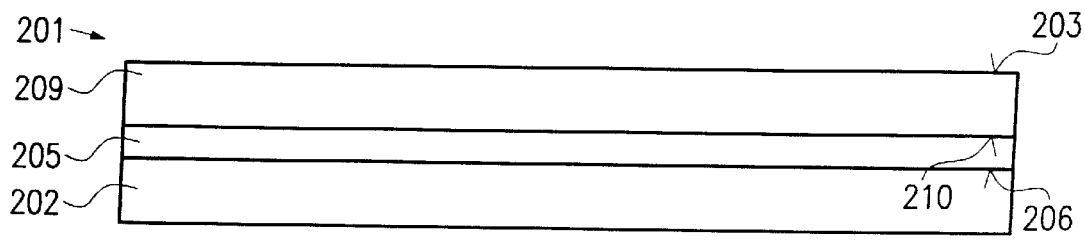
FIG. 2c is a schematic cross-sectional view of the lightly doped semiconductor substrate with implanted first ions after a second implanting and annealing step.

FIG. 2c shows a schematic cross-sectional view of the wafer 201 of FIG. 2a further comprising a second implanted layer 209. According to a second implantation and annealing process, the second implanted layer 209 is formed by implanting a second species of ions, which is a counterdoping species to the first species, through surface 203 into the first implanted layer 205 with a second implantation dose. Between the second implanted layer 209 and the first implanted layer 205, a second pn-junction 210 is formed at a second desired implantation depth, which is smaller than the first desired implantation depth. Due to the second pn-junction 210, the second implanted layer 209 is electrically isolated from the first implanted layer 205. A measurement of the sheet-resistance by a four-point-probe technique will again enable conclusions about the actually implanted dose of ions of the second species.

Figure 2D:
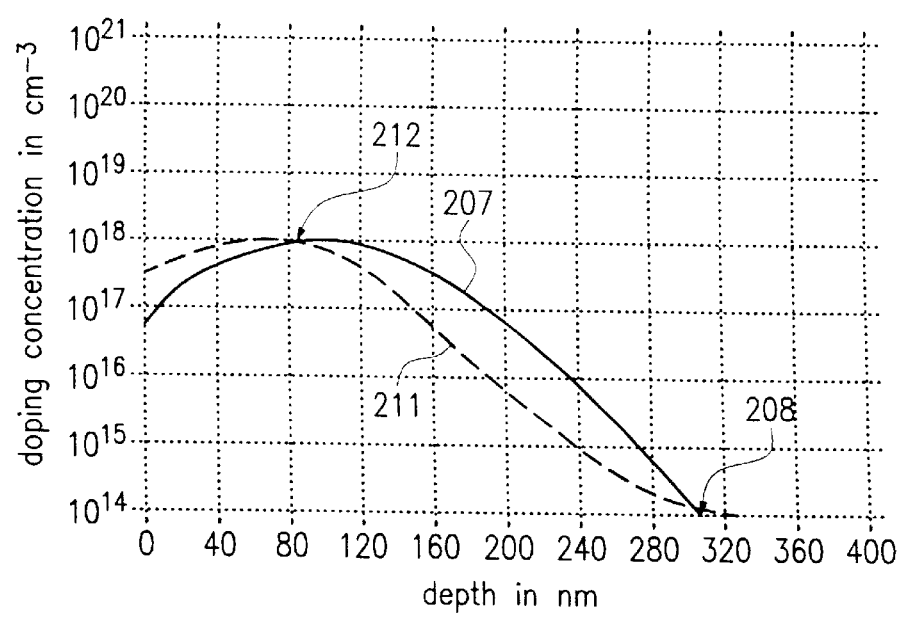
FIG. 2d is a diagram of the graph of FIG. 2b and of a graph as a result from a simulation of the implantation of second ions in a lightly doped semiconductor substrate with implanted first ions according to FIG. 2c.

FIG. 2d shows a diagram of the graph 207 and of a graph 211 as a result of the exemplary computer-simulation for the wafer according to FIG. 2c. The graph 207 is already described in FIG. 2b. The graph 211 represents an ion-substitution of a second species of implanted ions in the first implanted layer 205 and a second implanted layer 209 formed thereby according to a sheet-resistance of about 10 kΩ/□. The implantation of the ions of the second species is performed with an implantation energy of 80 keV and an implantation dose of $1 \times 10^{13}$ ions per cm$^2$. The crossing of graphs 207 and 211 shows that the second pn-junction 210 is formed at a depth of about 95 nm under the surface 203 of the wafer 201. The second pn-junction 210 is represented in the graphs 207 and 211 by crossing point 212.

Figure 2E:
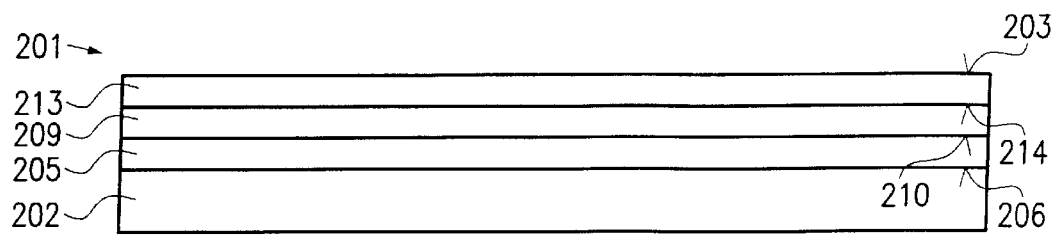
FIG. 2e is a schematic cross-sectional view of the lightly doped semiconductor substrate with implanted first and second ions after a third implanting and annealing step.

FIG. 2e shows a schematic cross-sectional view of the wafer 201 of FIG. 2c further comprising a third implanted layer 213. According to a third implantation and annealing process, the third implanted layer 213 is formed by implanting a third species of ions, which is a counterdoping species to the second species, through surface 203 into the second implanted layer 209 with a third implantation dose. Between the third implanted layer 213 and the second implanted layer 209, a third pn-junction 214 is formed in a third desired implantation depth that is smaller than the second desired implantation depth. Due to the third pn-junction 214, the third implanted layer 213 is electrically isolated from the second implanted layer 209. A measurement of the sheet-resistance by a four-point-probe technique will again enable conclusions about the actually implanted dose of ions of the third species.

Figure 2F:
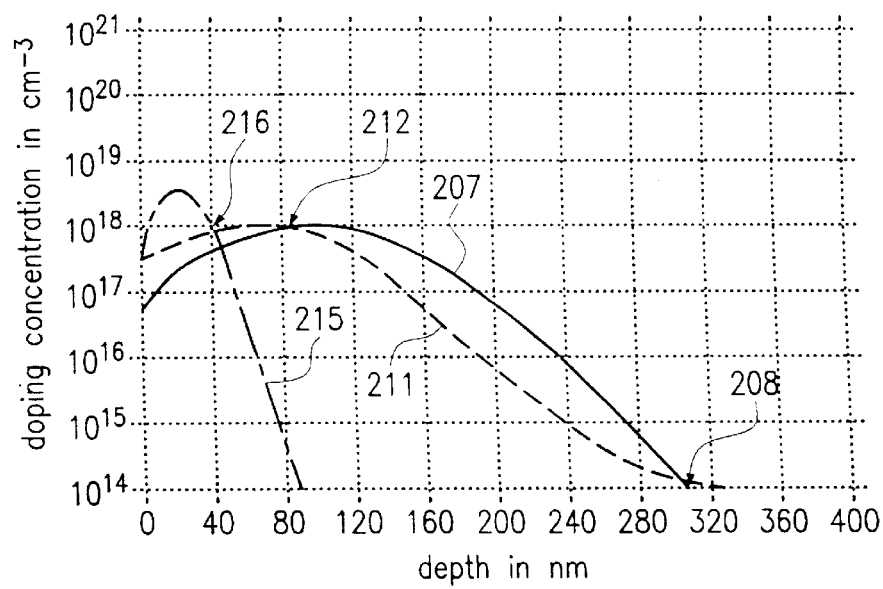
FIG. 2f is a diagram of the graphs of FIG. 2d and of a graph as a result of a simulation of the implantation of third ions in a lightly doped semiconductor substrate with implanted first and second ions according to FIG. 2e.

FIG. 2f shows a diagram of the graphs 207 and 211 and of a graph 215 as a result from the exemplary computer-simulation for the wafer according to FIG. 2e. The graphs 207 and 211 have already been described above in conjunction with FIG. 2d. The graph 215 represents an ion-substitution of a third species of implanted ions in the second implanted layer 209 and a third implanted layer 213 formed thereby according to a sheet-resistance of about 3850 Ω/□. The implantation of the ions of the third species is assumed with an implantation energy of 30 keV and an implantation dose of $1 \times 10^{13}$ ions per cm$^2$. The crossing of the graphs 215 and 211 implies that the third pn-junction 216 is formed at a depth of about 41 nm under the surface 203 of the wafer 201. The third pn-junction 214 is represented in the graphs 207, 211 and 215 by crossing point 216.

Since it is important from a cost-of-manufacturing standpoint to keep the test wafer-to-product wafer ratio as low as possible, the above example of monitoring ion-implantation provides for a substantial reduction of the total test wafer consumption. While conventional parameter-monitoring during production of field-effect transistors on a semiconductor substrate requires three test wafers per substrate to control the implanting and annealing conditions during the formation of the active region, of the lightly doped drain and source regions, and of the drain and source regions, according to this invention, the consumption of test wafers during production of field-effect transistors is reduced to only one test wafer per manufactured substrate.

A further embodiment of this invention relates to a reuse of test wafers by cycles of ion-implantation, rapid thermal annealing and monitoring such that the same implanting conditions are repeatedly applied to the same wafer. The same implanting conditions comprise using the same species for ion-implantation. Monitoring of implantation parameters, especially uniformity of the implantation concentration across the wafer, is performed by repeated four-point-probe sheet-resistance measurements. This type of measurement is well known to the person skilled in the art. The implantation concentrations of the later implantation steps result from the net-resulting sheet-resistance, which is the difference between the measured values of the sheet-resistance before and after an implantation and an anneal. This means that the net-resulting sheet-resistance gives exact information about the added implantation concentration. The aforementioned is especially true to the extent that the species of subsequent implantations undergo an equal amount of electrical activation, i.e., constant annealing conditions are applied.

The ion-implantation, RTA and monitoring steps can basically be repeated until the total concentration of the monitored implanted ions approaches the threshold for saturation. In this case, no additional ions will be built into the lattice of the wafer by means of substitution. This results in a significant reduction of the sheet-resistance sensitivity. As long as a clear distinction between the subsequently-measured sheet-resistances is possible, the sheet-resistance difference sensitivity lies beyond the threshold. Therefore, the ion-dose differences between the subsequent implantations should be low enough to allow a maximum number of iterations before the total dose results in sheet-resistance saturation. These ion-dose differences, however, have to be high enough to allow a clear distinction between the subsequently measured sheet-resistances. Preferably, the implantation doses correspond to doses actually used in device fabrication.

As is evident from the above discussion, the method according to this embodiment of the invention may be applied to any known implant species.

This embodiment of this invention is described by the following detailed example.

An implantation of arsenic, with a dose of $1.2 \times 10^{13}$ ions per $cm^2$ at an implantation energy of 80 keV into a silicon wafer having a doping concentration of $1 \times 10^{15}$ arsenic ions per $cm^3$ and an RTA annealing step for 30 s at a temperature of 1050° C., can be repeated five times before the threshold of about 10% of the sheet-resistance difference sensitivity is approached. Therefore, such a test wafer can be used five times for monitoring. This leads to a test wafer-to-product wafer ratio that is five times lower than according to the commonly known prior art.

While a rapid thermal anneal has been described in the method according to this invention, it will be appreciated that any other type of anneal such as a furnace anneal would be well known to persons skilled in the art and may be considered as well for practicing the present invention.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the present invention. It is to be understood that the form of the invention shown and described herein is to be taken as the presently preferred embodiments. Elements and materials may be substituted for those illustrated and described herein.

What is claimed:

1. A method of monitoring implantation parameters for characterization of an implantation apparatus, the method comprising:
    a) providing a substrate for use as a test wafer for monitoring the implantation parameters in an implantation chamber of the implantation apparatus;
    b) implanting first ions of a first dopant type into the substrate;
    c) annealing the substrate with the first ions implanted;
    d) obtaining the implantation parameters by measuring implantation-dependent characteristics of the substrate with the first ions implanted;
    e) implanting second ions of a dopant type that is opposite to said first dopant type into the substrate with the first ions implanted;
    f) annealing the substrate with the first and second ions implanted;
    g) obtaining the implantation parameters by measuring implantation-dependent characteristics of the substrate with the first and second ions implanted, reusing the substrate for measuring the implantation parameters;
    h) implanting third ions of a dopant type that is the same as said first dopant type into the substrate with said first and second ions implanted;
    i) annealing the substrate with the first, second and third ions implanted; and
    j) obtaining the implantation parameters by measuring implantation-dependent characteristics of the substrate with the first, second and third ions implanted, reusing the substrate for measuring the implantation parameters.

2. The method according to claim 1, wherein implanting first and second ions are performed under different implantation conditions for forming a pn-junction in the substrate, electrically decoupling a part of the substrate below the pn-junction from a part of the substrate above the pn-junction.

3. The method according to claim 1, wherein said substrate is annealed by rapid thermal annealing (RTA).

4. The method according to claim 3, wherein said substrate is annealed with constant annealing conditions.

5. The method according to claim 1, wherein measuring the implantation-dependent characteristics of said substrate comprises measuring a sheet resistance from which information about implantation concentration is derivable.

6. The method according to claim 1, wherein measuring the implantation-dependent characteristics of the substrate is performed at a plurality of locations distributed across the test wafer for analyzing the test wafer regarding non-uniformities with respect to the implantation parameters.

7. The method according to claim 1, wherein said substrate is lightly predoped with a dopant material that is of an opposite type to said first type of dopant material before implanting said first ions into the substrate.

8. The method according to claim 1, wherein said first and third ions are N-type dopant materials and said second ions are a P-type dopant material.

9. The method according to claim 1, wherein said first and third ions are P-type dopant materials and said second ions are an N-type dopant material.

* * * * *